United States Patent
Sasaki et al.

(10) Patent No.: US 8,193,080 B2
(45) Date of Patent: Jun. 5, 2012

(54) METHOD FOR FABRICATING SEMICONDUCTOR DEVICE AND PLASMA DOPING SYSTEM

(75) Inventors: Yuichiro Sasaki, Osaka (JP); Katsumi Okashita, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 12/922,358

(22) PCT Filed: Mar. 26, 2010

(86) PCT No.: PCT/JP2010/002215
§ 371 (c)(1),
(2), (4) Date: Sep. 13, 2010

(87) PCT Pub. No.: WO2011/013271
PCT Pub. Date: Feb. 3, 2011

(65) Prior Publication Data
US 2011/0151652 A1    Jun. 23, 2011

(30) Foreign Application Priority Data

Jul. 27, 2009   (JP) ................. 2009-173964

(51) Int. Cl.
*H01L 21/42* (2006.01)
(52) U.S. Cl. .......... 438/513; 438/173; 438/206
(58) Field of Classification Search .......... 438/173, 438/206, 268, 513
See application file for complete search history.

(56) References Cited

U.S. PATENT DOCUMENTS

| | | |
|---|---|---|
| 2006/0175667 A1 | 8/2006 | Tsuchiaki |
| 2008/0179683 A1 | 7/2008 | Sasaki et al. |
| 2009/0020786 A1* | 1/2009 | Lenoble et al. ............... 257/213 |
| 2009/0176355 A1 | 7/2009 | Okumura et al. |

FOREIGN PATENT DOCUMENTS

| | | |
|---|---|---|
| JP | 10-125916 | 5/1998 |
| JP | 2006-216833 | 8/2006 |
| WO | WO 2006/114976 A1 | 11/2006 |
| WO | WO 2008/090771 A1 | 7/2008 |

OTHER PUBLICATIONS

B. Mizuno et al., "Plasma Doping into the Side-Wall of a Sub-0.5μm Width Trench," Extended Abstracts of International Conference on SSDM, p. 317 (1987).

D. Lenoble et al., "Evaluation of Plasma Doping for Sub-0.18μm Devices," 1998 International Conference Ion Implantation Technology Proceedings, p. 1222 (1999).

H. Kawasaki et al., Demonstration of Highly Scaled FinFET SRAM Cells with High-k/Metal Gate and Investigation Electron Device Meeting Technical Digest, p. 237 (2008).

* cited by examiner

*Primary Examiner* — Kevin M Picardat
(74) *Attorney, Agent, or Firm* — McDermott Will & Emery LLP (57) ABSTRACT

An impurity is introduced into a fin-type semiconductor region (102) formed on a substrate (100) using a plasma doping process, thereby forming an impurity-introduced layer (105). Carbon is introduced into the fin-type semiconductor region (102) using a plasma doping process to overlap at least a part of the impurity-introduced layer (105), thereby forming a carbon-introduced layer.

19 Claims, 7 Drawing Sheets

METHOD FOR FABRICATING SEMICONDUCTOR DEVICE AND PLASMA DOPING SYSTEM

RELATED APPLICATIONS

This application is the U.S. National Phase under 35 U.S.C. §371 of International Application No. PCT/JP2010/002215, filed on Mar. 26, 2010, which in turn claims the benefit of Japanese Application No. 2009-173964, filed on Jul. 27, 2009, the disclosures of which Applications are incorporated by reference herein.

TECHNICAL FIELD

The present invention relates to methods for fabricating a semiconductor device and plasma doping systems, and more particularly relates to a method for fabricating a semiconductor device including a fin-type semiconductor region.

BACKGROUND ART

Planar-type and fin-type semiconductor devices have been studied in order to miniaturize semiconductor devices each including a substrate, such as a silicon substrate. Such semiconductor devices mostly utilize reduction of the short channel effect by using source/drain extension regions (hereinafter simply referred to as extension regions). In order to reduce the short channel effect, shallow extension regions need to be formed, and a high concentration of an impurity needs to be implanted into the extension regions.

For this reason, a technique called plasma doping in which silicon, etc., is doped with an impurity by using plasma started to be developed in the late 1980s (see NON-PATENT DOCUMENT 1). Research and development have been directed at forming shallow extension regions of high impurity concentration using plasma doping since the late 1990s (see NON-PATENT DOCUMENTS 2 and 3).

CITATION LIST

Patent Document

PATENT DOCUMENT 1: Japanese Patent Publication No. H10-125916 NON-PATENT DOCUMENT NON-PATENT DOCUMENT 1: B. Mizuno, et al., "Plasma Doping into the Side-Wall of a Sub-0.5 µm Width Trench," Ext. Abs. of International Conference on SSDM, p. 317 (1987)

NON-PATENT DOCUMENT 2: D. Lenoble, et al., "Evaluation of Plasma Doping for Sub-0.18 µm Devices," 1998 Int. Conf. Ion Implantation Technology Proc., p. 1222 (1999)

NON-PATENT DOCUMENT 3: H. Kawasaki, et al., "Demonstration of Highly Scaled FinFET SRAM Cells with High-k/Metal Gate and Investigation of Characteristic Variability for the 32 nm Node and Beyond," International Electron Device Meeting Technical Digest, p. 237 (2008)

SUMMARY OF THE INVENTION

Technical Problem

However, according to the conventional fabrication method described in NON-PATENT DOCUMENTS 1 and 2 described above, extension regions each having an ultra-shallow junction depth cannot be formed which are required for a further miniaturized fin-type semiconductor device (a semiconductor device including a fin-type semiconductor region on a substrate), such as a fin-type field effect transistor (FET). This cannot sufficiently reduce the short channel effect.

In view of the above, it is an object of the present invention to allow a fin-type semiconductor device to include an impurity-introduced layer having a desired shallow junction depth.

Solution to the Problem

In order to achieve the above-described object, the present inventors considered that the following method described in PATENT DOCUMENT 1, etc., is used to fabricate a fin-type semiconductor device. Specifically, in the method, carbon ions and impurity ions are sequentially implanted into a silicon substrate, the resultant silicon substrate is then subjected to heat treatment, and thus, interstitial silicon is trapped by carbon to suppress diffusion of the impurity in the depth direction, thereby forming an impurity layer having an ultra-shallow junction depth.

However, when, according to the method of PATENT DOCUMENT 1, arsenic ions were implanted into a fin-type semiconductor region by ion implantation, and then, carbon ions were implanted thereinto by ion implantation, this implantation showed that the problem described below was caused.

Figure 7:
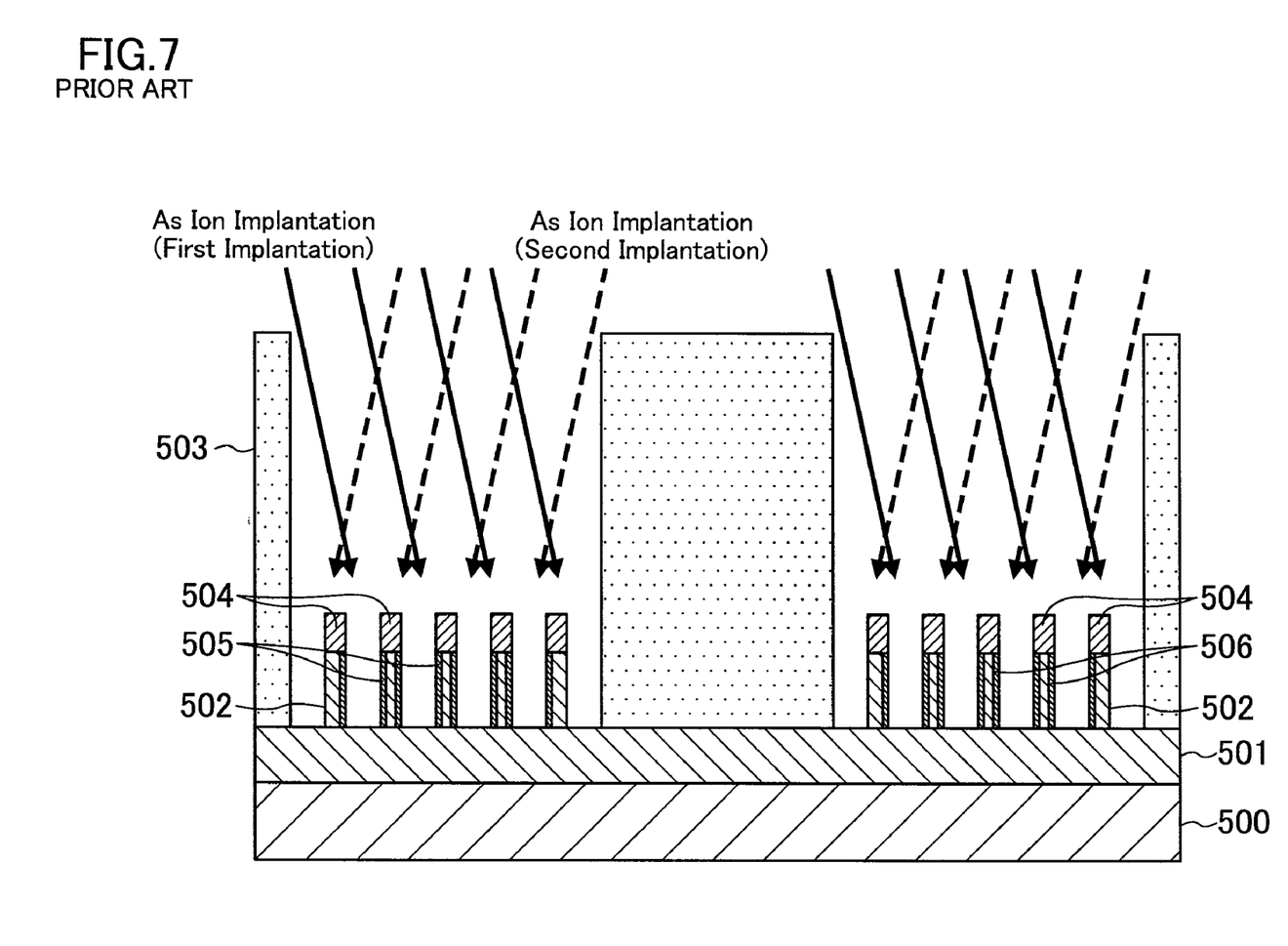
FIG. 7 is a cross-sectional view illustrating the structure of a semiconductor device in a process step of a conventional method for fabricating a semiconductor device.

FIG. 7 is a schematic view of a cross section of a fin-type semiconductor device when arsenic ions are implanted into fin-type semiconductor regions (see NON-PATENT DOCUMENT 3). As illustrated in FIG. 7, in order to implant arsenic ions into the side surfaces of fin-type semiconductor regions 502 formed on a silicon substrate 500 with a silicon oxide film 501 interposed therebetween by using a resist pattern 503 as a mask, the ion implantation angle (which is 0° when ions are implanted vertically into an object) needs to be set at an angle which is oblique to the silicon substrate 500 without being vertical thereto. However, when this ion implantation angle is too large, arsenic ions are blocked by the resist pattern 503, and thus, cannot reach the fin-type semiconductor regions 502. Specifically, the ion implantation angle at which arsenic ions can be implanted into the side surfaces of the fin-type semiconductor regions 502 is limited to the range determined by the height of each of the fin-type semiconductor regions 502, the height of the resist pattern 503, the distance between each adjacent pair of the fin-type semiconductor regions 502, etc. In the case illustrated in FIG. 7, the height of each fin-type semiconductor region 502 is 60 nm, the width thereof is 10 nm, the distance between each adjacent pair of the fin-type semiconductor regions 502 is 20 nm, and the height of the resist pattern 503 is 210 nm, thereby setting the ion implantation angle at 12 degrees. This case causes the first problem where this case requires a first implantation process for implanting arsenic ions into the left side surface of each fin-type semiconductor region 502, and a second implantation process for implanting arsenic ions into the right side surface of the fin-type semiconductor region 502, i.e., two ion implantation processes, leading to a reduction in productivity. An impurity-implanted layer 504 is formed in an upper portion of the fin-type semiconductor region 502 by the first and second implantation processes; an impurity-implanted layer 505 is formed in a left side portion of the fin-type semiconductor region 502 by the first implantation process; and an impurity-implanted layer 506 is formed in a right side portion of the fin-type semiconductor region 502 by the second implantation process.

Incidentally, when, as described above, the ion implantation angle is set at 12 degrees, arsenic collides with the top surface of each fin-type semiconductor region 502 at an angle of 12 degrees while colliding with the side surfaces thereof at an angle of 78 degrees. Here, while the arsenic ions colliding with the semiconductor region at a small ion implantation angle of approximately 12 degrees tend to enter the semiconductor region, many of the arsenic ions colliding with the semiconductor region at a large ion implantation angle of approximately 78 degrees are repelled from the surface of the semiconductor region, and thus, such arsenic ions are less likely to enter the semiconductor region. In particular, in ion implantation at low energy, e.g., for use in the formation of extension regions, when ions collide with the surface of the semiconductor region at an ion implantation angle as large as 78 degrees, the percentage of ions which can enter the inside of the semiconductor region is very low, i.e., approximately 10% of all the implanted ions. As such, in the case illustrated in FIG. 7, the difference between the dose of the arsenic ions implanted into the upper portion of the fin-type semiconductor region 502 by the first implantation process and the dose of the arsenic ions implanted into the left side portion of the fin-type semiconductor region 502 by the first implantation process is large, such as approximately 10:1. The same applies to the second implantation process, and thus, after the two arsenic ion implantation process steps, the difference between the dose of the arsenic ions implanted into the upper portion of the fin-type semiconductor region 502 and the dose of the arsenic ions implanted into each of side portions of the fin-type semiconductor region 502 is much greater than 10:1. The above description substantially applies also to implantation of carbon ions. Specifically, when the method of PATENT DOCUMENT 1 is used to fabricate a fin-type semiconductor device, this causes the second problem where it is difficult to reduce the resistance of an impurity layer formed in each of side portions of a fin-type semiconductor region.

Furthermore, when, as illustrated in FIG. 7, a plurality of (specifically, five) fin-type semiconductor regions 502 are aligned within a region surrounded by the resist pattern 503 used as the mask, arsenic ions are blocked by the resist pattern 503 so as not to be implanted into a left side portion of, e.g., the leftmost fin-type semiconductor region 502 even with the first implantation process. Specifically, no impurity-implanted layer 505 is formed in the left side portion of the leftmost fin-type semiconductor region 502. For a similar reason, arsenic ions are not implanted into a right side portion of, e.g., the rightmost fin-type semiconductor region 502 even with the second implantation process, and thus, no impurity-implanted layer 506 is formed in the right side portion of the rightmost fin-type semiconductor region 502. By contrast, arsenic ions are implanted into both side surfaces of each of three centrally-located ones of the five aligned fin-type semiconductor regions 502 by the first and second implantation processes, thereby forming impurity-implanted layers 505 and 506. When, as described above, the method of PATENT DOCUMENT 1 is used to fabricate a fin-type semiconductor device, this causes significant differences in the resistance of the impurity-implanted layer among the fin-type semiconductor regions on the substrate, thereby causing the third problem where the on-state currents of the fin-type semiconductor devices are nonuniform across the surface of the substrate.

Therefore, the present inventors conceived a method in which carbon and an impurity are implanted into a fin-type semiconductor region by plasma doping in order to avoid the first problem (the problem of the need for two ion implantation processes), the second problem (the problem of the increase in the resistance of an impurity layer in each of side portions of the fin-type semiconductor region), and the third problem (the problem of nonuniform on-state currents of fin-type semiconductor devices across the surface of a substrate) which are described above. According to this method, an impurity can be implanted into both side portions of each of fin-type semiconductor regions by one plasma doping process, thereby providing greater throughput than when ion implantation is used. Furthermore, an impurity is more easily introduced into side portions of the fin-type semiconductor region than when ion implantation is used, thereby forming impurity layers providing low resistance in the side portions of the fin-type semiconductor region. Furthermore, the implantation doses for the fin-type semiconductor regions can be uniform, thereby allowing the on-state currents of fin-type semiconductor devices to be uniform across the surface of the substrate. If, in this method, plasma doping of carbon and plasma doping of an impurity are performed in the same chamber, this can provide the above-described advantage without increasing the number of systems. By contrast, ion implantation of carbon ions and impurity ions essentially requires a system for ion implantation of carbon ions and a system for ion implantation of impurity ions, i.e., at least two systems.

Furthermore, the present inventors attempted to introduce carbon and an impurity by plasma doping under various conditions, and obtained the following finding.

When, e.g., arsenic is introduced by plasma doping, the use of a mixture containing an As-containing gas diluted with a diluent gas, such as hydrogen, and adjustment of the concentration of the As-containing gas in the mixture are generally conducted in order to introduce a desired amount of arsenic. Specifically, in order to ensure the controllability of the arsenic dose in plasma doping, $AsH_3$ is diluted with hydrogen, and thus, the concentration of $AsH_3$ needs to be set at a low concentration of equal to or less than 5%. When a plasma of such a mixture is used, not only arsenic ions but also ions from a diluent gas, such as hydrogen ions generated by making the diluent gas into a plasma, collide with the surfaces of a resist patterned, as an implantation mask, on the substrate in a plasma doping process step for the arsenic introduction. Here, when the ions in the plasma repeat collision with the resist surfaces, this causes curing of the resist, and thus, makes it difficult to remove the resist in a resist removal process step, such as cleaning or ashing. Here, the resist is cured not only by collision of impurity ions, i.e., arsenic ions, but also by collision of ions from a diluent gas (such as hydrogen ions). Specifically, in the plasma doping process step for the arsenic introduction, curing of the resist proceeds depending on the amount of the colliding arsenic ions and the amount of the colliding ions from the diluent gas.

Similarly, also when, e.g., carbon is introduced by plasma doping, the dilution of a carbon-containing gas with a diluent gas, such as hydrogen, and adjustment of the concentration of the carbon-containing gas are conducted in order to introduce a desired amount of carbon. Therefore, in a plasma doping process step for the carbon introduction, curing of the resist proceeds depending on the amount of the colliding carbon ions and the amount of the colliding ions from the diluent gas.

Therefore, the present inventors conceived a method in which carbon and an impurity are simultaneously introduced into fin-type semiconductor regions by plasma doping, i.e., a method in which plasma doping is performed using a plasma of a gas containing both carbon and an impurity. This method can prevent the following problem.

Specifically, when separately performing the plasma doping process step for the impurity (e.g., arsenic) introduction and the plasma doping process step for the carbon introduction, even if the resist can be removed with the level of curing corresponding to the sum of the amount of the colliding arsenic ions and the amount of the colliding carbon ions, the resist may be cured due to the amount of the colliding ions from a diluent gas used in the plasma doping process steps, thereby making it impossible to remove the resist.

In particular, the following plasma doping conditions tend to make it impossible to remove the resist: the concentration of the As-containing gas in the plasma doping process step for the arsenic introduction is lower than that of the diluent gas, and the concentration of the carbon-containing gas in the plasma doping process step for the carbon introduction is lower than that of the diluent gas. More specifically, when the plasma doping process step for the arsenic introduction and the plasma doping process step for the carbon introduction are separately performed under the plasma doping conditions where while the concentration of the gas containing an impurity or carbon is reduced, the concentration of the diluent gas is increased, the amount of the colliding ions from the diluent gas in both of the process steps is much greater than the amount of the colliding ions from the diluent gas in each of the process steps. This may make it impossible to remove the resist mainly due to curing of the resist arising from collision of the ions from the diluent gas.

The problem of curing of a resist arising from such collision of ions cannot be caused by ion implantation, and is unique to plasma doping. Specifically, e.g., when arsenic ions are implanted by ion implantation, ions other than the arsenic ions are previously isolated by a mass spectrograph, thereby preventing the ions other than the arsenic ions from colliding with a resist on a substrate. Similarly, also when carbon ions are implanted by ion implantation, ions other than the carbon ions are previously isolated by a mass spectrograph, thereby preventing the ions other than the carbon ions from colliding with the resist on the substrate. Therefore, even if an arsenic ion implantation process step and a carbon ion implantation process step are separately performed, only arsenic ions and carbon ions collide with the resist, thereby facilitating removing the resist.

As described above, the present inventors have found that when an impurity, such as arsenic, and carbon are introduced into fin-type semiconductor regions by plasma doping, the amount of the colliding ions from a diluent gas needs to be reduced as much as possible in order to ensure the removability of the resist, and thus, conceived a method in which carbon and an impurity are simultaneously introduced into fin-type semiconductor regions by plasma doping.

Even when plasma doping of carbon and plasma doping of an impurity are not simultaneously performed, a sufficient reduction in the sum of the time required for plasma doping of carbon and the time required for plasma doping of an impurity can clearly ensure the removability of the resist.

For example, if, in order to prevent the upper corners of fin-type semiconductor regions from being chipped during plasma doping, the internal chamber pressure is set at, e.g., 0.35 Pa, and in order to prevent an impurity from entering regions of the fin-type semiconductor regions located under a gate electrode in forming extension regions and sources/drains by plasma doping, the bias voltage (Vpp) is set at 250 V, the total time during which the fin-type semiconductor regions are exposed to a plasma in the two process steps for plasma doping of an impurity (e.g., arsenic) and plasma doping of carbon (the total plasma exposure time) is preferably equal to or less than 72 seconds in view of the resist removability. In other words, if the total plasma exposure time is equal to or less than 72 seconds, the resist can be easily removed by chemical cleaning, etc. By contrast, if the total plasma exposure time is longer than 72 seconds, curing of the resist proceeds, thereby making it difficult to remove the resist by chemical cleaning, etc.

Here, the above-described numerical values are described by way of example. Clearly, in view of the resist removability, an appropriate limit (maximum time) may be imposed on the total plasma exposure time, depending on the plasma doping conditions, such as the internal chamber pressure and the bias voltage. For example, when the internal chamber pressure is set lower than 0.35 Pa, or when the bias voltage is set lower than 250 V, this allows the total plasma exposure time to be longer than 72 seconds described above.

Preferably, a gas which is used for plasma doping of carbon and an impurity into the fin-type semiconductor regions and which contains carbon or such an impurity does not contain oxygen. This can prevent semiconductor forming the fin-type semiconductor regions and the introduced impurity from being oxidized to thereby prevent the resistance of impurity regions (e.g., extension regions) formed in the fin-type semiconductor regions from increasing, thereby preventing degradation in the characteristics of a fin-type semiconductor device. Specifically, for example, a gas of carbon and hydrogen may be used as a gas containing carbon, and, for example, a gas of an impurity and hydrogen may be used as a gas containing an impurity.

Helium is preferably used as a diluent gas which is used for plasma doping of carbon and an impurity into the fin-type semiconductor regions and with which a gas containing carbon or an impurity is diluted. This can reduce chipping of the upper corners of the fin-type semiconductor regions due to helium ions from the diluent gas because helium is an element of relatively low atomic weight. Although hydrogen is an element having the smallest atomic weight, helium exhibiting extremely low reactivity with other elements is more preferably used as the diluent gas than hydrogen. The reason for this is that a hydrogen plasma is more capable of chipping the fin-type semiconductor regions than a helium plasma because the union of hydrogen radicals and silicon in a plasma forms $Si_xH_y$.

The present invention has been made based on the above finding, and specifically, a method for fabricating a semiconductor device according to the present invention includes: introducing an impurity into a fin-type semiconductor region formed on a substrate using a plasma doping process, thereby forming an impurity-introduced layer; and introducing carbon into the fin-type semiconductor region using a plasma doping process, thereby forming a carbon-introduced layer to overlap at least a part of the impurity-introduced layer.

According to the semiconductor device fabrication method of the present invention, since the impurity-introduced layer and the carbon-introduced layer are formed in the fin-type semiconductor region by plasma doping, this can suppress diffusion of an impurity in the depth direction, thereby forming the impurity-introduced layer having an ultra-shallow junction depth. Furthermore, bonded impurities in the fin-type semiconductor region can be separated from each other by carbon, thereby increasing the activation yield of the impurity by heat treatment after the formation of the impurity-introduced layer. Moreover, an impurity can be introduced into both side portions of the fin-type semiconductor region by one plasma doping process, thereby providing greater throughput than when ion implantation is used. Furthermore, an impurity is more easily introduced into the side portions of the fin-type semiconductor region than when ion implantation is used, thereby forming impurity-introduced layers providing low resistance in the side portions of the fin-type semiconductor region. Furthermore, for example, also when a resist pattern used as a mask to form the impurity-introduced layer surrounds a plurality of fin-type semiconductor regions, the implantation doses for the fin-type semiconductor regions can be uniform, thereby allowing the on-state currents of fin-type semiconductor devices to be uniform across the surface of the substrate.

Also when, in the semiconductor device fabrication method of the present invention, for example, nitrogen is used instead of carbon, the above-described advantage can be obtained.

When, in the method of the present invention, the forming the impurity-introduced layer and the forming the carbon-introduced layer are performed in a same chamber, the above-described advantage can be obtained without increasing the number of systems. In this case, when the forming the impurity-introduced layer and the forming the carbon-introduced layer are simultaneously performed using a mixture of a gas containing the impurity and a gas containing carbon, this can prevent a situation where curing of a resist used as a mask for the carbon or impurity introduction makes it impossible for the resist to be removed.

When, in the method of the present invention, the forming the impurity-introduced layer includes forming an amorphous layer to overlap at least a portion of the impurity-introduced layer while allowing a crystalline layer to remain inside the fin-type semiconductor region, the introduced impurity can be subjected to activation annealing with high efficiency, thereby further reducing the resistance of the impurity-introduced layer. In this case, the method may further include, after the forming the impurity-introduced layer and the forming the carbon-introduced layer, subjecting the amorphous layer to a heat treatment to recover crystallinity of the amorphous layer.

When, in the method of the present invention, the forming the impurity-introduced layer and the forming the carbon-introduced layer are each performed at a pressure of equal to or less than 0.35 Pa, this can prevent the upper corners of the fin-type semiconductor region from being chipped during plasma doping. In this case, when the forming the impurity-introduced layer and the forming the carbon-introduced layer are each performed at a bias voltage of equal to or less than 250 V, this can prevent an impurity from entering regions of the fin-type semiconductor regions located under a gate electrode during plasma doping. Furthermore, in this case, when a total plasma treatment time in the forming the impurity-introduced layer and the forming the carbon-introduced layer is equal to or less than 72 seconds, this can prevent a situation where curing of a resist used as a mask for the carbon or impurity introduction makes it impossible for the resist to be removed.

When, in the method of the present invention, a total plasma treatment time in the forming the impurity-introduced layer and the forming the carbon-introduced layer is equal to or less than a maximum total plasma treatment time previously set based on the pressures and bias voltages in both of the forming the impurity-introduced layer and the forming the carbon-introduced layer, this can prevent a situation where curing of a resist used as a mask for the carbon or impurity introduction makes it impossible for the resist to be removed.

In the method of the present invention, the forming the impurity-introduced layer may be performed using a first gas containing at least one element selected from boron, arsenic, and phosphorus, and the forming the carbon-introduced layer may be performed using a second gas containing carbon. In this case, when the first gas and the second gas are used while being diluted with helium, this can prevent the upper corners of the fin-type semiconductor region from being chipped during plasma doping. Furthermore, in this case, when the second gas is a gas containing carbon and hydrogen, this can prevent semiconductor forming the fin-type semiconductor region and the introduced impurity from being oxidized, and thus, the resistance of the impurity-introduced layer (e.g., the extension region) formed in the fin-type semiconductor region can be prevented from increasing, thereby preventing degradation in the characteristics of the fin-type semiconductor device. Moreover, in this case, when the first gas is a gas containing boron and hydrogen, a gas containing arsenic and hydrogen, or a gas containing phosphorus and hydrogen, and the second gas contains carbon and hydrogen and has a lower molecular weight than the first gas, this can prevent semiconductor forming the fin-type semiconductor region and the introduced impurity from being oxidized, thereby preventing the resistance of the impurity-introduced layer (e.g., the extension region) formed in the fin-type semiconductor region from increasing, and thus, preventing degradation in the characteristics of the fin-type semiconductor device. In this case, the following advantage is obtained. Specifically, the carbon-introduced layer can be deeper than the impurity-introduced layer, thereby forming an impurity-introduced layer having a shallower junction depth. In order to obtain such an advantage, for example, the first gas may be $B_2H_6$, and the second gas may be $CH_4$ (methane). Alternatively, the first gas may be $AsH_3$, and the second gas may be $CH_4$ (methane), $C_2H_6$ (ethane), $C_3H_6$ (cyclopropane), $C_2H_8$ (propane), $C_4H_{10}$ (butane), or $C_4H_{10}$ (isobutane). Alternatively, the first gas may be $PH_3$, and the second gas may be $CH_4$ (methane) or $C_2H_6$ (ethane). However, in order to prevent the leakage current caused by the carbon-introduced layer, the carbon-introduced layer may be shallower than the impurity-introduced layer.

A plasma doping system of the present invention is directed to a plasma doping system for use in the above-described method of the present invention, and includes: a chamber in which the substrate is placed; a first gas supply unit for supplying a gas containing the impurity into the chamber; and a second gas supply unit for supplying a gas containing carbon into the chamber.

The plasma doping system of the present invention enables the implementation of the method of the present invention. In particular, since the forming the impurity-introduced layer and the forming the carbon-introduced layer can be performed in a same chamber, the above-described advantages can be provided by the method of the present invention without increasing the number of systems.

The plasma doping system of the present invention may further include a third gas supply unit for supplying a diluent gas into the chamber.

Advantages of the Invention

According to the present invention, an impurity and carbon can be introduced into the fin-type semiconductor region using a plasma doping process without reducing throughput and increasing the number of systems, thereby improving the performance of a semiconductor device, in particular, a three-dimensional device, such as a fin-type semiconductor device, while providing greater economy in device fabrication.

DESCRIPTION OF EMBODIMENTS

A method for fabricating a semiconductor device and a plasma doping system according to an embodiment of the present invention will be described hereinafter with reference to the drawings. In this embodiment, the following case will be described as an example. Specifically, in an inductively coupled plasma (ICP) doping system, plasma doping is performed at a lower pressure of 0.35 Pa than usual using a plasma of a mixture obtained by diluting $B_2H_6$ and $CH_4$ with He, and thus, while boron is implanted into the top surfaces of fin-type semiconductor regions and implanted into or adhered to the side surfaces of the fin-type semiconductor regions, carbon is implanted into the top surfaces of the fin-type semiconductor regions and implanted into or adhered to the side surfaces of the fin-type semiconductor regions. Then, the implanted or adhered boron is electrically activated by heat treatment, thereby increasing the on-state current of the fin-type semiconductor device.

Figure 1:
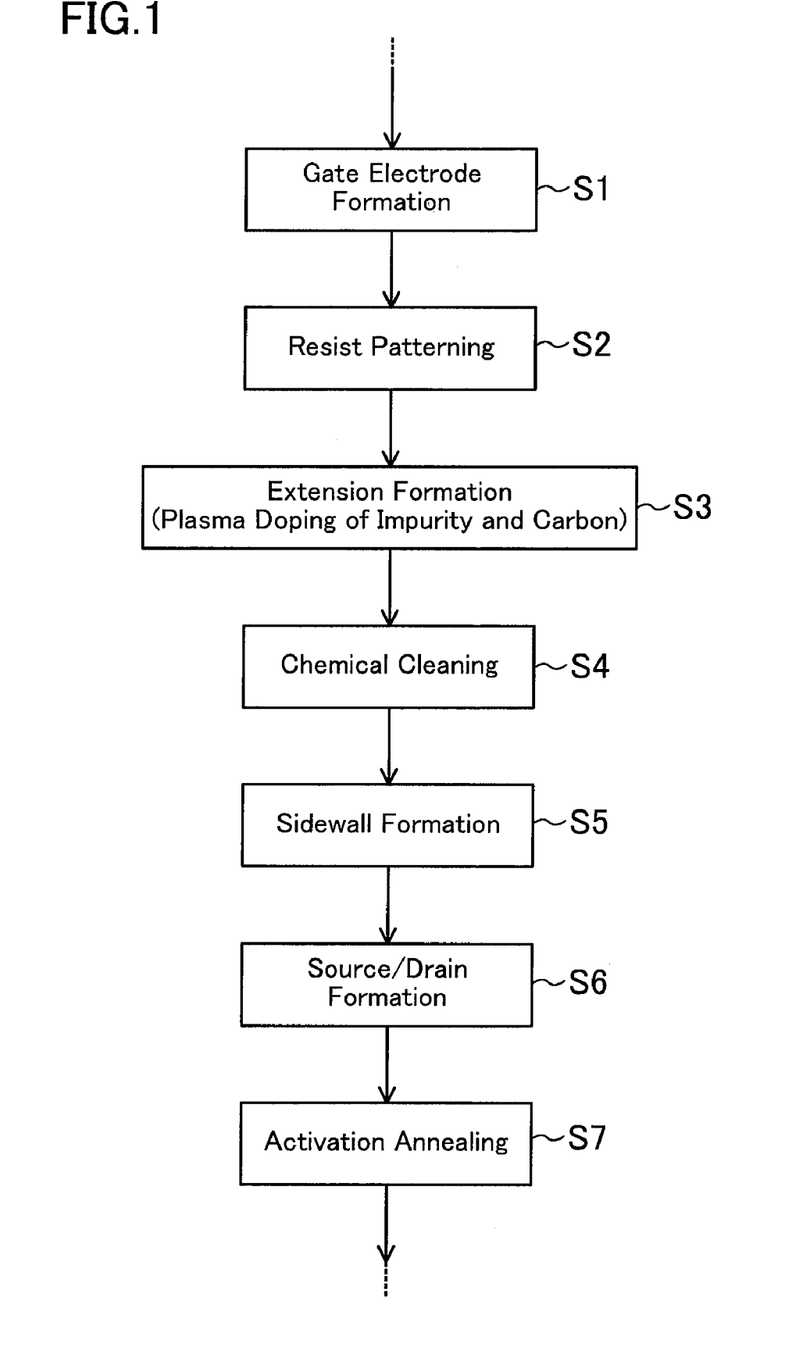
FIG. 1 is a process flow of a method for fabricating a semiconductor device according to an embodiment of the present invention.

FIG. 1 is a process flow diagram of the method for fabricating a semiconductor device (specifically, a fin-type semiconductor device) according to this embodiment. FIGS. 2(a)-2(f) are perspective views illustrating the structure of a fin-type semiconductor device in process steps of the process flow diagram illustrated in FIG. 1.

Figure 2:
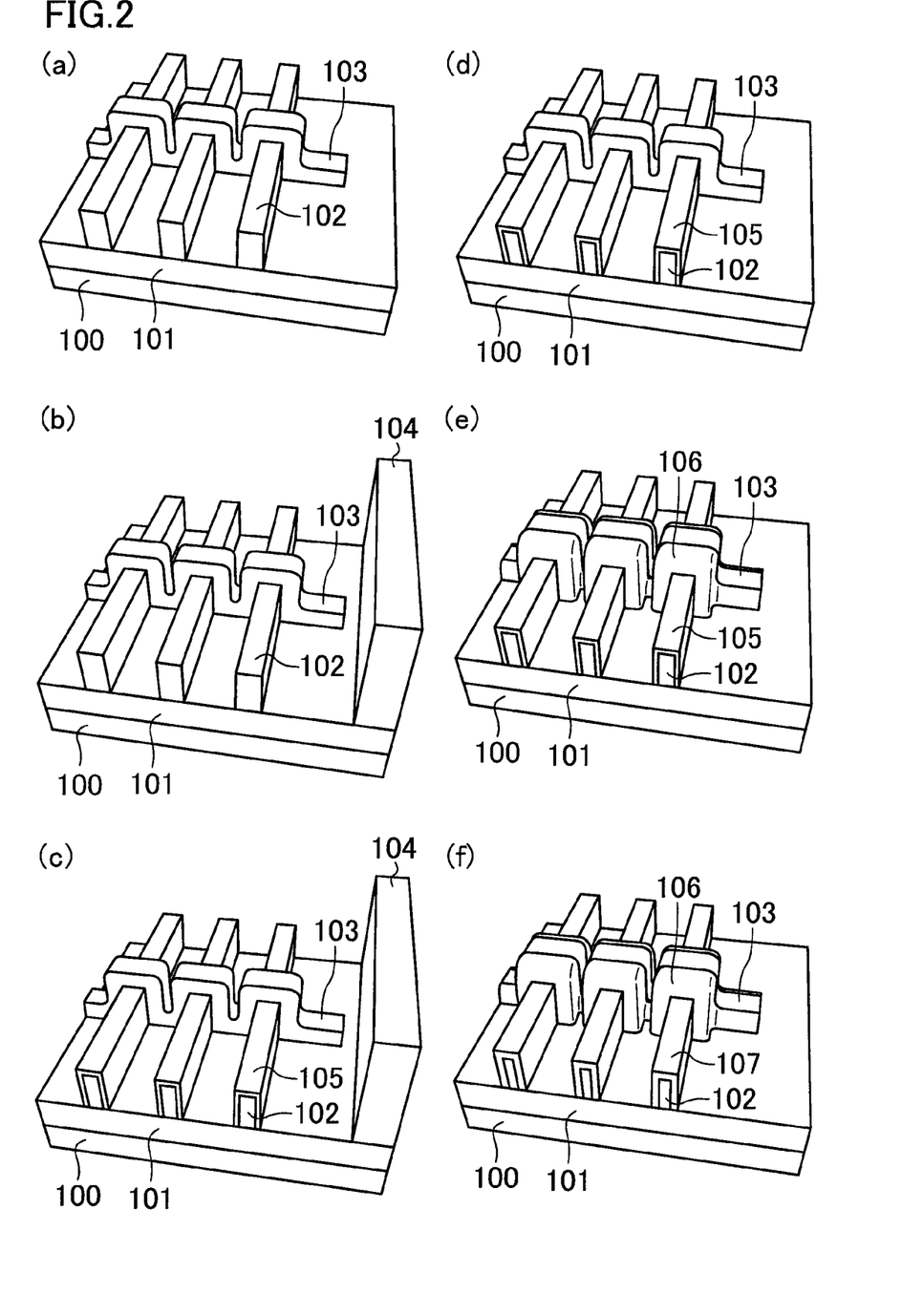
FIGS. 2(a)-2(f) are perspective views illustrating the structure of a semiconductor device in process steps of the method for fabricating a semiconductor device according to the embodiment of the present invention.

First, in step S1, as illustrated in FIG. 2(a), a plurality of fin-type semiconductor regions 102 are formed by patterning a silicon layer (i.e., an upper silicon layer of a semiconductor on insulator (SOI) substrate) formed on a semiconductor substrate 100 made of, e.g., silicon with an insulating film (BOX oxide layer) 101 interposed between the silicon layer and the semiconductor substrate 100, and a gate electrode 103 is formed astride the fin-type semiconductor regions 102 with a gate insulating film (not shown) interposed therebetween. Here, the width (Wfin) of each fin-type semiconductor region 102 is, for example, 10 nm; the height (Hfin) thereof is, for example, 60 nm; the interval (S) between each adjacent pair of the fin-type semiconductor regions 102 is, for example, 20 nm; and the gate width (Wg) is, for example, 20 nm.

Next, in step S2, as illustrated in FIG. 2(b), a resist pattern 104 is formed on the insulating film 101 to expose a region into which a desired dopant (e.g., boron) is to be implanted. Here, the height of the resist pattern 104 is, for example, 210 nm.

Next, in step S3, a plasma containing boron and carbon is applied to each fin-type semiconductor region 102 by plasma doping. Thus, as illustrated in FIG. 2(c), boron-introduced layers serving as extension regions 105 are formed in upper and side portions of the fin-type semiconductor regions 102 outside the gate electrode 103, and carbon-introduced layers (not shown) are formed to overlap at least parts of the boron-introduced layers.

Here, the plasma doping conditions are such that the plasma generation method is an ICP method, the material gas is a mixture, diluted with He, of $B_2H_6$ and $CH_4$, the $B_2H_6$ concentration in the material gas and the $CH_4$ concentration therein are 0.5% by mass and 0.2% by mass, respectively, the internal chamber pressure is 0.35 Pa, the source power (the plasma-generating high-frequency power) is 500 W, the bias voltage Vpp is 250 V, the substrate temperature is 20° C., and the plasma exposure time is 72 seconds. However, no bias voltage is applied for the first 12 seconds of the 72-second plasma exposure time, and a bias voltage of 250 V is applied for the remaining 60 seconds.

Next, in step S4, as illustrated in FIG. 2(d), the resist pattern 104 is removed, e.g., by chemical cleaning, and then, in step S5, as illustrated in FIG. 2(e), insulative sidewall spacers 106 are formed to cover the side surfaces of the gate electrode 103, thereby protecting the extension regions 105.

Next, in step S6, boron is relatively deeply implanted into each fin-type semiconductor region 102. Thus, as illustrated in FIG. 2(f), source/drain regions 107 are formed in upper and side portions of the fin-type semiconductor regions 102 outside the gate electrode 103 and the insulative sidewall spacers 106. Thereafter, in step S7, boron in the extension regions 105 and the source/drain regions 107 is electrically activated by activation annealing. In this case, in the extension regions 105, not only boron but also carbon are implanted into or adhered to layers changed into amorphous silicon by plasma doping, and thus, a large amount of boron can be electrically activated by activation annealing, thereby reducing the resistance of the extension regions 105 in the upper and side portions of the fin-type semiconductor regions 102.

The principal portion of the fin-type semiconductor device can be completed through the above-described process steps.

According to the semiconductor device fabrication method of this embodiment, since the impurity-introduced layers (specifically, the extension regions 105) and the carbon-introduced layers are formed in the fin-type semiconductor regions 102 by plasma doping, this can suppress diffusion of an impurity (specifically, boron) in the depth direction, thereby forming impurity-introduced layers each having an ultra-shallow junction depth. Furthermore, bonded impurities in each fin-type semiconductor region 102 can be separated from each other by carbon, thereby increasing the activation yield of the impurity by heat treatment after the formation of the impurity-introduced layers. Moreover, an impurity can be introduced into both side portions of the fin-type semiconductor region 102 by one plasma doping process, thereby providing greater throughput than when ion implantation is used. Furthermore, an impurity is more easily introduced into the side portions of the fin-type semiconductor region 102 than when ion implantation is used, thereby forming impurity-introduced layers providing low resistance in the side portions of the fin-type semiconductor region 102. Furthermore, for example, also when the resist pattern 104 used as a mask to form the impurity-introduced layers surrounds the plurality of fin-type semiconductor regions 102, the implantation doses for the fin-type semiconductor regions 102 can be uniform, thereby allowing the on-state currents of fin-type semiconductor devices to be uniform across the surface of the substrate.

According to the semiconductor device fabrication method of this embodiment, since the process step of forming the impurity-introduced layers and the process step of forming the carbon-introduced layers are simultaneously performed in the same chamber, this can provide the above-described advantages without increasing the number of systems, and can prevent a situation where curing of the resist used as a mask for the carbon or impurity introduction makes it impossible for the resist to be removed.

In the semiconductor device fabrication method of this embodiment, the use of, e.g., nitrogen instead of carbon can also provide the above-described advantages.

In the semiconductor device fabrication method of this embodiment, the plasma doping in the step S3 is preferably performed at a pressure of equal to or less than 0.35 Pa. This can prevent the upper corners of the fin-type semiconductor regions 102 from being chipped during plasma doping.

In the semiconductor device fabrication method of this embodiment, the plasma doping in the step S3 is preferably performed at a bias voltage of equal to or less than 250 V. This can prevent an impurity from entering regions of the fin-type semiconductor regions 102 located under the gate electrode 103 during plasma doping.

In the semiconductor device fabrication method of this embodiment, when the plasma doping in the step S3 is performed at an internal chamber pressure of 0.35 Pa and a bias voltage of 250 V, the total plasma treatment time in the step S3 is preferably set at 72 seconds or less. This can prevent a situation where curing of the resist used as a mask for the carbon or impurity introduction makes it impossible for the resist to be removed. Here, if the internal chamber pressure is set lower than 0.35 Pa, or if the bias voltage is set lower than 250 V, the total plasma treatment time in the step S3 can be longer than 72 seconds described above. In other words, the total plasma treatment time for the plasma doping in the step S3 is preferably within the maximum time previously set based on the internal chamber pressure and the bias voltage both during the plasma doping.

Figure 3:
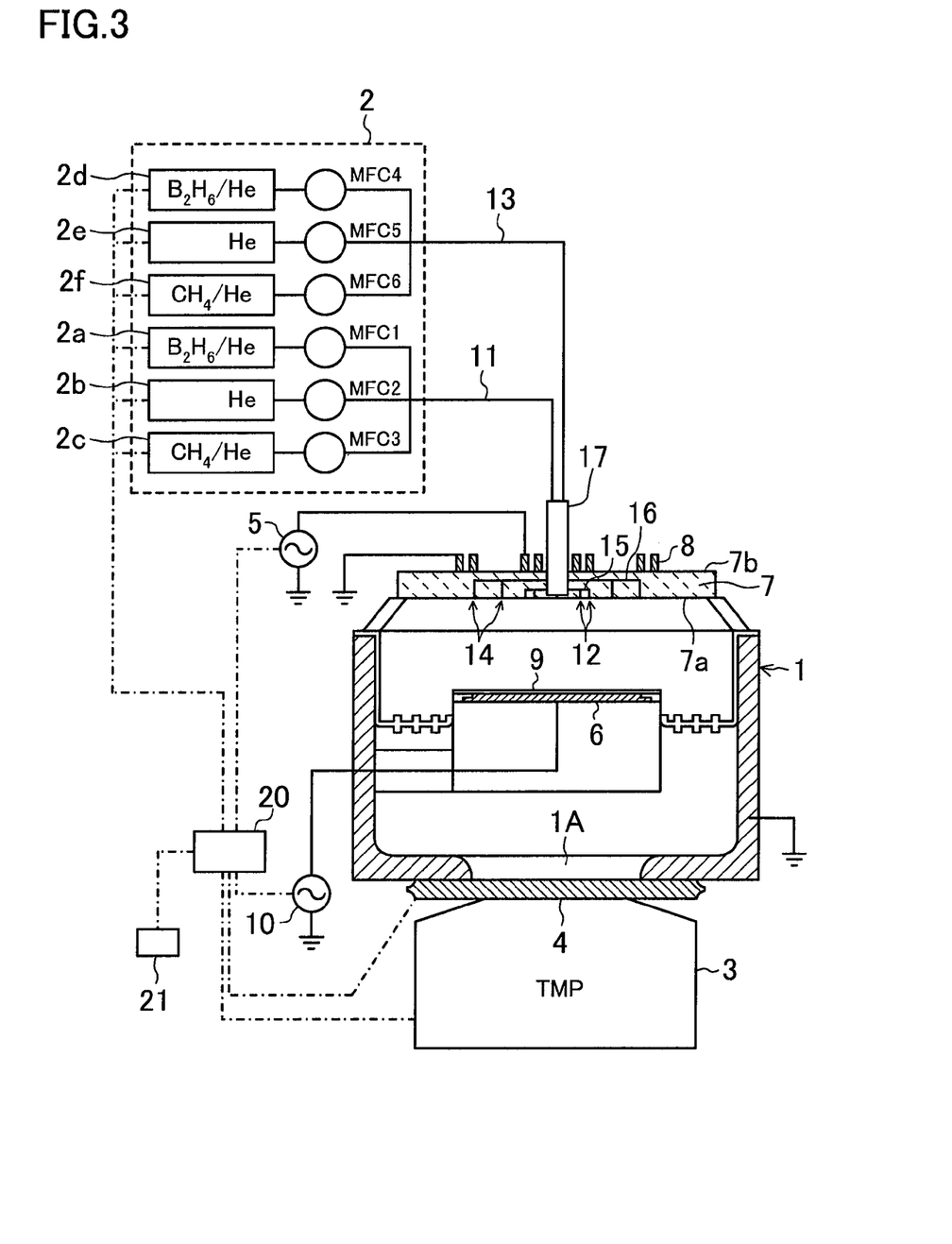
FIG. 3 is a cross-sectional view illustrating a schematic structure of a plasma doping system for use in the method for fabricating a semiconductor device according to the embodiment of the present invention.

A plasma doping system (hereinafter referred to as the plasma doping system of this embodiment) for use in the semiconductor device fabrication method of this embodiment will be described hereinafter. FIG. 3 is a cross-sectional view illustrating a schematic structure of the plasma doping system of this embodiment.

According to the plasma doping system illustrated in FIG. 3, while predetermined gases are introduced from a gas supply unit 2 into a vacuum chamber (chamber) 1, the gases can be discharged through a turbomolecular pump 3 which is an example of an exhauster. Here, the internal pressure of the vacuum chamber 1 can be kept at a predetermined pressure by using a pressure controlling valve 4. A high-frequency power of, e.g., 13.56 MHz is supplied to a coil 8 provided in the vicinity of a top plate 7 for the vacuum chamber 1 by using a high-frequency power supply 5, thereby generating a plasma in the vacuum chamber 1. A silicon substrate 9 (on which fin-type semiconductor regions are formed and) which is an example of a sample is placed on a sample electrode 6 which is provided in the vacuum chamber 1 while being opposed to the top plate 7. Here, the sample electrode 6 is, for example, a generally circular stage on which the silicon substrate 9 can be placed. The sample electrode 6 is provided with a high-frequency power supply 10 for supplying a high-frequency power to the sample electrode 6, and the high-frequency power supply 10 functions as a voltage source for controlling the electrical potential of the sample electrode 6 such that the silicon substrate 9 has a negative potential with respect to the plasma. A controller 20 is connected to the gas supply unit 2 (including an impurity material gas supply unit 2a, a helium supply unit 2b, a carbon material gas supply unit 2c, an impurity material gas supply unit 2d, a helium supply unit 2e, a carbon material gas supply unit 2f, and first through sixth mass flow controllers MFC1-MFC6), the turbomolecular pump 3, the pressure controlling valve 4, the high-frequency power supply 5, and the high-frequency power supply 10 to control the operations of these components. The operations of these components under control of the controller 20 are stored, as information, in a memory 21 if needed, and the information previously stored in the memory 21 is read by the controller 20, thereby performing the operations.

In the plasma doping system having a configuration as described above and illustrated in FIG. 3, ions in the plasma generated in the vacuum chamber 1 are accelerated toward the surface of the silicon substrate 9 to collide with the surface of the substrate, gas components and radicals in the plasma are adsorbed onto the surface of the silicon substrate 9 as an example of a sample, thereby introducing impurities into the surface of the silicon substrate 9. A gas supplied from the gas supply unit 2 is discharged through an air exit 1A provided in the bottom of the vacuum chamber 1 into the turbomolecular pump 3. The turbomolecular pump 3 and the air exit 1A are disposed directly below the sample electrode 6.

In the plasma doping system illustrated in FIG. 3, a gas is supplied through the gas supply unit 2 and at least two pipes including a first gas supply pipe 11 and a second gas supply pipe 13 to a gas passage formation member 17 placed upright on a generally central portion of the (outer) surface 7b of the top plate 7 opposite to the vacuum chamber inner surface 7a opposed to the sample electrode 6. The gas passage formation member 17 may be formed as a portion of the top plate 7. Furthermore, at least two gas passages (a first gas passage 15 and a second gas passage 16) extend from the gas passage formation member 17 into the top plate 7, and a gas is supplied into the vacuum chamber 1 through substrate central portion gas ejection ports 12 which are rotationally symmetrical about the center of the top plate 7 (i.e., the central axis of the substrate 9) and substrate peripheral portion gas ejection ports 14 which are also rotationally symmetrical thereabout.

In this embodiment, a gas is supplied from the gas supply unit 2 to an upper end portion of the gas passage formation member 17 placed upright on the central portion of the outer surface 7b of the top plate 7 through the first gas supply pipe 11 in the following manner. Here, the flow rate and concentration of a gas which is for use in plasma doping and which contains an impurity material gas and a carbon material gas are controlled to respective predetermined values by the mass flow controllers MFC1, MFC2, and MFC3 provided in the gas supply unit 2. Specifically, in this embodiment, a gas obtained by diluting an impurity material gas (e.g., diborane ($B_2H_6$)) and a carbon material gas (e.g., methane ($CH_4$)) with helium (such that the $B_2H_6$ concentration in the gas and the $CH_4$ concentration therein are 0.5% by mass and 0.2% by mass, respectively) is used as a gas for use in plasma doping. Therefore, the flow rate of the impurity material gas supplied from the impurity material gas supply unit 2a is controlled by the first mass flow controller MFC1; the flow rate of helium (He) supplied from the helium supply unit 2b is controlled by the second mass flow controller MFC2; and the flow rate of the carbon material gas supplied from the carbon material gas supply unit 2c is controlled by the third mass flow controller MFC3. The gases each having a flow rate controlled by the corresponding one of the first, second, and third mass flow controllers MFC1, MFC2, and MFC3 are mixed in the gas supply unit 2 to produce a gas (mixture) for use in plasma doping, and then, the mixture is supplied through the first gas supply pipe 11 and the gas passage formation member 17 to the first gas passage 15. The mixture supplied to the first gas passage 15 is supplied into the vacuum chamber 1 through the plurality of substrate central portion gas ejection ports 12 formed in regions, opposed to the central portion of the silicon substrate 9, of the vacuum chamber inner surface 7a of the top plate 7 opposed to the silicon substrate 9. Here, the mixture flowing out of the plurality of substrate central portion gas ejection ports 12 is supplied toward the central portion of the silicon substrate 9.

Similarly, a gas is supplied from the gas supply unit 2 to an upper end portion of the gas passage formation member 17 placed upright on the central portion of the outer surface 7b of the top plate 7 through the second gas supply pipe 13 in the following manner. Here, the flow rate and concentration of a gas which is for use in plasma doping and which contains an impurity material gas and a carbon material gas are controlled to respective predetermined values by the mass flow controllers MFC4, MFC5, and MFC6 provided in the gas supply unit 2. Specifically, in this embodiment, a gas obtained by diluting an impurity material gas (e.g., diborane ($B_2H_6$)) and a carbon material gas (e.g., methane ($CH_4$)) with helium (such that the $B_2H_6$ concentration in the gas and the $CH_4$ concentration therein are 0.5% by mass and 0.2% by mass, respectively) is used as a gas for use in plasma doping. Therefore, the flow rate of the impurity material gas supplied from the impurity material gas supply unit 2d is controlled by the fourth mass flow controller MFC4; the flow rate of helium (He) supplied from the helium supply unit 2e is controlled by the fifth mass flow controller MFC5; and the flow rate of the carbon material gas supplied from the carbon material gas supply unit 2f is controlled by the sixth mass flow controller MFC6. The gases each having a flow rate controlled by the corresponding one of the fourth, fifth, and sixth mass flow controllers MFC4, MFC5, and MFC6 are mixed in the gas supply unit 2 to produce a gas (mixture) for use in plasma doping, and then, the mixture is supplied through the second gas supply pipe 13 and the gas passage formation member 17 to the second gas passage 16. The mixture supplied to the second gas passage 16 is supplied into the vacuum chamber 1 through the plurality of substrate peripheral portion gas ejection ports 14 formed in regions, opposed to a peripheral portion of the silicon substrate 9, of the vacuum chamber inner surface 7a of the top plate 7 opposed to the silicon substrate 9. Here, the mixture flowing out of the plurality of substrate peripheral portion gas ejection ports 14 is supplied toward the peripheral portion of the silicon substrate 9.

In the above-described manner, in this embodiment, a mixture obtained by diluting diborane ($B_2H_6$) used as an example of the impurity material gas and methane ($CH_4$) used as an example of the carbon material gas with helium (He) to desired mass concentrations can be supplied into the vacuum chamber 1.

Therefore, plasma doping is performed using such a plasma doping system as illustrated in FIG. 3 by applying a plasma of a mixture of $B_2H_6$, $CH_4$, and He to the silicon substrate 9 in the same vacuum chamber 1, thereby introducing boron and carbon using a single system. This is economically very advantageous because the use of ion implantation requires at least two systems including a system for boron implantation and a system for carbon implantation.

Figure 4:
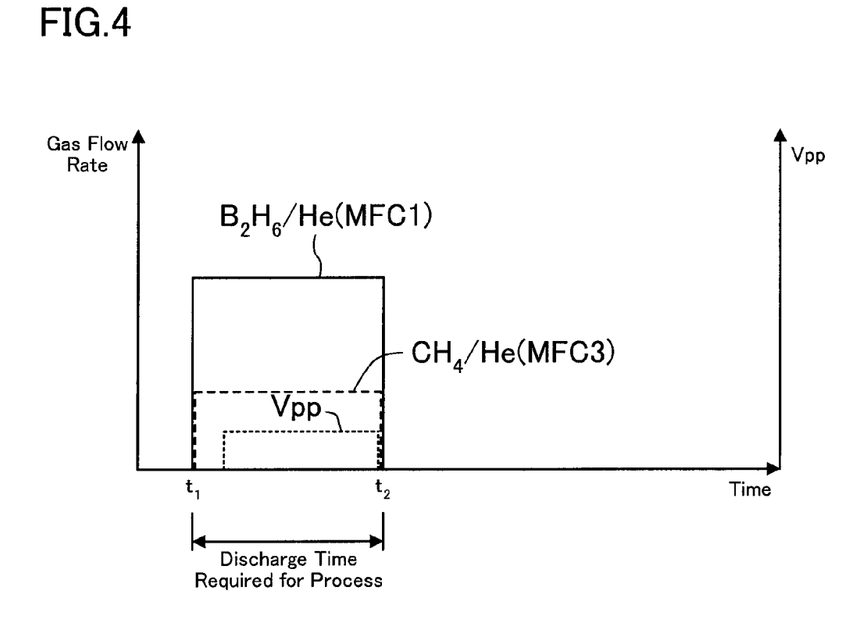
FIG. 4 is a graph illustrating variations with time in the flow rates of gases and the bias voltage when plasma doping is performed in the method for fabricating a semiconductor device according to the embodiment of the present invention.
Figure 5:
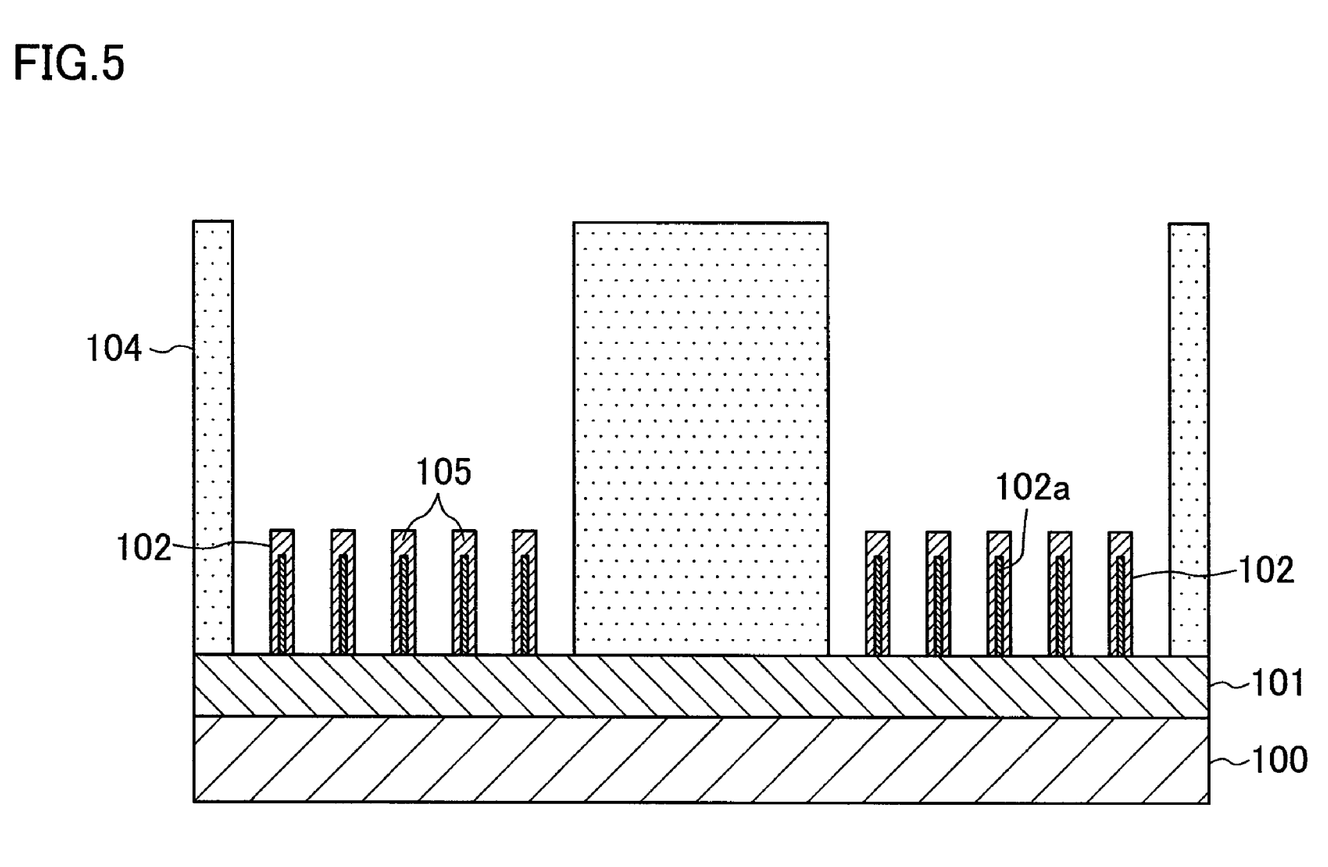
FIG. 5 is a cross-sectional view illustrating the structure of a semiconductor device in a process step in the method for fabricating a semiconductor device according to the embodiment of the present invention.

FIG. 4 illustrates variations with time in the flow rates of the gases and the bias voltage Vpp when, in this embodiment, plasma doping is performed using such a mixture as described above. In this embodiment, as illustrated in FIG. 4, $B_2H_6$/He (a gas obtained by diluting $B_2H_6$ with He) and $CH_4$/He (a gas obtained by diluting $CH_4$ with He) starts being passed through the mass flow controllers MFC1 and MFC3, respectively, at time $t_1$. Although not shown, helium also starts being passed through the mass flow controller MFC2 at time $t_1$. After a plasma of the mixture is stabilized (e.g., 12 seconds after time $t_1$), the application of the bias voltage Vpp is started, and thus, ions in the plasma are accelerated toward the silicon substrate 9, thereby starting implantation of the ions into the silicon substrate 9. Then, the bias voltage Vpp is applied, e.g., for 60 seconds, and then the supply of the gases from the mass flow controllers MFC1, MFC2, and MFC3 and the application of the bias voltage Vpp are stopped at time $t_2$. Thus, plasma discharge terminates at time $t_2$. Therefore, in this embodiment, the discharge time required for plasma doping for the single silicon substrate (wafer) 9 is the time period from time $t_1$ to time $t_2$ (e.g., 72 seconds). This time period is much shorter than the required time when ion implantation is used within a range of low bias voltages, such as 250 V. Furthermore, in order to form impurity-implanted layers in both side portions of fin-type semiconductor regions by using ion implantation, at least two ion implantation processes are needed as illustrated in FIG. 7. By contrast, in this embodiment, impurity-introduced layers (specifically, extension regions 105) can be formed in both side portions of the fin-type semiconductor regions 102 by one plasma doping process as illustrated in FIGS. 2(c) and 5, thereby allowing the plasma doping time of this embodiment to be much shorter than when ion implantation is used. This applies also to carbon introduction, and thus, according to this embodiment, boron and carbon can be introduced not only into an upper portion of each fin-type semiconductor region 102 but also into both side portions thereof at respective desired doses by short-time plasma doping. Although FIG. 5 is a cross sectional view corresponding to the perspective view in FIG. 2(c), the shapes and dimensions illustrated in FIG. 2(c) are changed for comparison with a conventional structure illustrated in FIG. 7.

The formation of amorphous layers using plasma doping in the semiconductor device fabrication method of this embodiment will be described hereinafter.

As described above, FIG. 2(c) illustrates a situation which occurs after a plasma containing boron and carbon is applied to the fin-type semiconductor regions 102 in plasma doping of this embodiment, and FIG. 5 is a cross-sectional view corresponding to the perspective view in FIG. 2(c). This plasma exposure allows boron and carbon to be adhered to or implanted into the top and side surfaces of the fin-type semiconductor regions 102, thereby forming the boron-introduced layers serving as the extension regions 105 in the upper and side portions of the fin-type semiconductor regions 102 and forming the carbon-introduced layers to overlap at least parts of the boron-introduced layers. Here, although not shown, amorphous layers are formed to overlap the boron-introduced layers and the carbon-introduced layers. Specifically, the impingement of a large amount of helium ions and small amounts of boron ions, carbon ions, and hydrogen ions which are all contained in the plasma allows silicon crystals forming the fin-type semiconductor regions 102 to be changed into amorphous silicon, thereby forming the amorphous layers.

In this embodiment, as illustrated in FIG. 5, plasma doping is performed while crystal regions 102a remain inside (central portions of) the fin-type semiconductor regions 102. Thus, annealing after the plasma doping allows the crystallinity of each amorphous layer to be recovered using the crystals in the central portions of the fin-type semiconductor regions 102 as the seeds, and consequently, the entire fin-type semiconductor regions 102 are returned to the crystalline state after this annealing. This reduces the resistance of the impurity-introduced layers (i.e., extension regions 105), thereby increasing the on-state current of the fin-type semiconductor device. In this embodiment, since plasma doping is performed at a low pressure of, e.g., 0.35 Pa, and the time during which the fin-type semiconductor regions 102 are exposed to the plasma is set short, e.g., at 72 seconds, this allows the amount of chipping of each of the upper corners of the fin-type semiconductor regions 102 to be ultra-small (e.g., less than 1 nm), thereby further increasing the on-state current of the fin-type semiconductor device. Furthermore, the plasma doping of this embodiment does not cause differences in the amounts of the introduced boron and carbon among the plurality of fin-type semiconductor regions 102 surrounded by the resist pattern 104, for example, as illustrated in FIG. 5, thereby reducing variations among the on-state currents of a plurality of fin-type semiconductor devices.

As described above, in this embodiment, the plasma doping using a mixture of $B_2H_6$, $CH_4$, and He allows boron and carbon to be simultaneously implanted into or adhered to the top and side surfaces of the fin-type semiconductor regions 102 while also enabling the formation of amorphous layers. The amorphous layers each have a higher light absorption rate than a crystal, and efficiently absorb light during annealing after the plasma doping, and thus, the rate of boron activation is increased, thereby reducing the resistance of the impurity-introduced layers (extension regions 105). Therefore, according to this embodiment, the amorphous layers are formed simultaneously with the boron and carbon introduction, thereby reducing the resistance of the impurity-introduced layers formed in the fin-type semiconductor regions 102, i.e., increasing the on-state current of the fin-type semiconductor device, while maintaining good resist removability. In terms of the above-described advantage provided by the amorphous layers, the amorphous layers are preferably deep enough to include the entire boron-introduced layers and the entire carbon-introduced layers. However, in order to recover the crystallinity of the amorphous layers by annealing after the plasma doping, the crystal regions 102a need to remain inside (the central portions of) the fin-type semiconductor regions 102.

Figure 6:
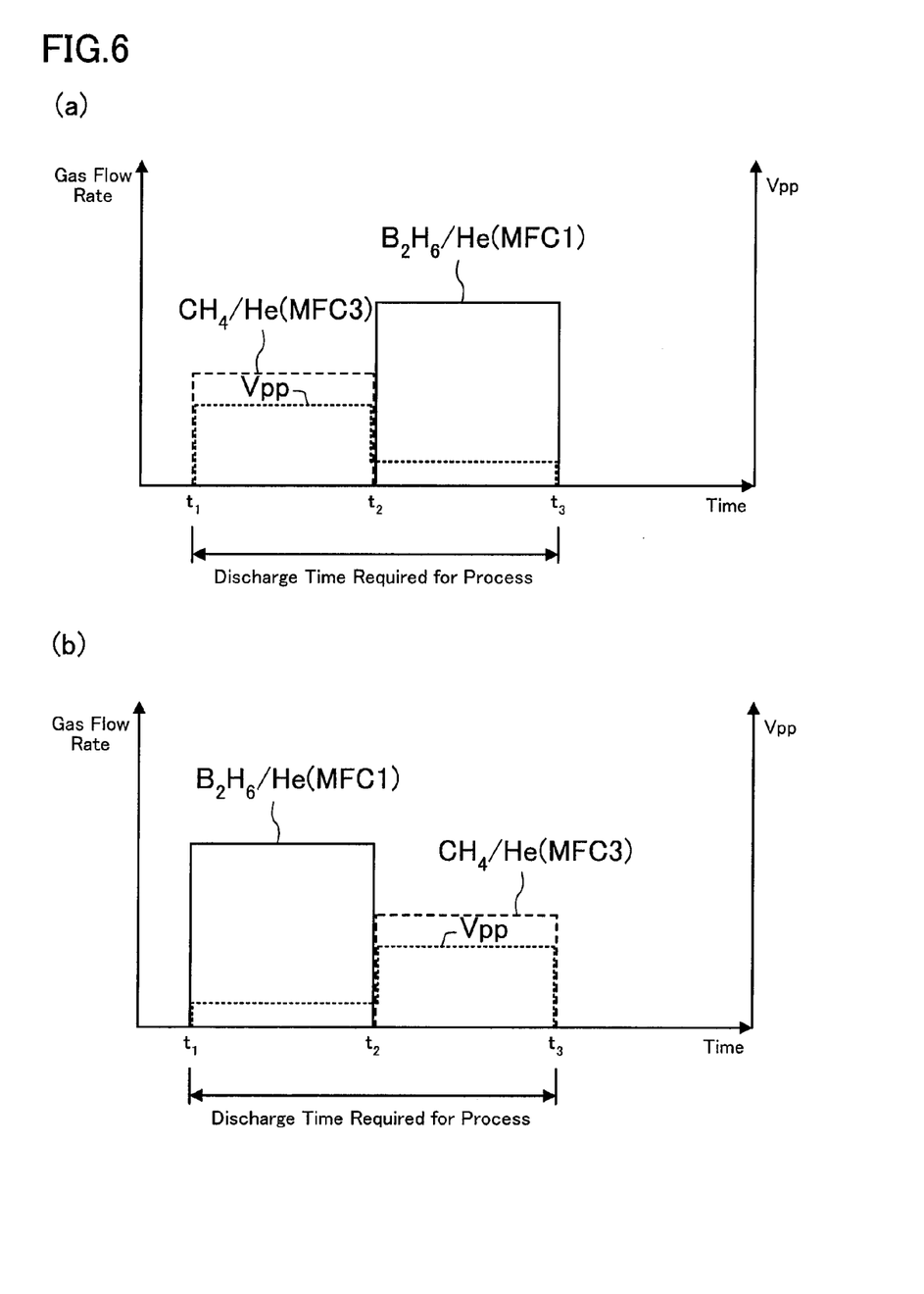
FIGS. 6(a) and 6(b) are graphs each illustrating variations with time in the flow rates of gases and the bias voltage when plasma doping is performed in a method for fabricating a semiconductor device according to a variation of the embodiment of the present invention.

In this embodiment, as illustrated in FIG. 4, a gas containing an impurity (e.g., $B_2H_6$/He) and a gas containing carbon (e.g., $CH_4$/He) are simultaneously supplied into the chamber, thereby simultaneously conducting the formation of the impurity-introduced layers and the formation of the carbon-introduced layers. However, alternatively, for example, as illustrated in FIG. 6(a), a gas containing carbon (e.g., $CH_4$/He) may be previously supplied into the chamber to thereby form the carbon-introduced layers, and then a gas containing an impurity (e.g., $B_2H_6$/He) may be supplied into the chamber to thereby form the impurity-introduced layers. In this case, the time of supply of the gas containing carbon and the time of supply of the gas containing the impurity may partially coincide with each other. Alternatively, for example, as illustrated in FIG. 6(b), a gas containing an impurity (e.g., $B_2H_6$/He) may be previously supplied into the chamber to thereby form the impurity-introduced layers, and then a gas containing carbon (e.g., $CH_4$/He) may be supplied into the chamber to thereby form the carbon-introduced layers. Also in this case, the time of supply of the gas containing the impurity and the time of supply of the gas containing carbon may partially coincide with each other. However, in any case, in view of the resist removability, the maximum time determined based on the internal chamber pressure, the bias voltage, etc., is imposed on the sum of the plasma exposure time in the process step of forming the impurity-introduced layers and the plasma exposure time in the process step of forming the carbon-introduced layers. If the sum of the plasma exposure times is within the maximum time, the process step of forming the impurity-introduced layers and the process step of forming the carbon-introduced layers may be performed using different plasma doping systems (i.e., different chambers).

Although, in this embodiment, $B_2H_6$ is used as a gas containing an impurity in order to form impurity-introduced layers (extension regions 105) in the fin-type semiconductor regions 102, the gas containing the impurity is not limited to $B_2H_6$. For example, a gas containing at least one element selected from boron, arsenic, and phosphorus may be used. Although $CH_4$ is used as a gas containing carbon in order to form the carbon-introduced layers in the fin-type semiconductor regions 102, the gas containing carbon is not limited to $CH_4$, and other gases containing carbon may be used. Although He (helium) is used as a diluent gas for the gas containing the impurity and the gas containing carbon, the diluent gas is not limited to He, and other diluent gases may be used. However, since helium is an element of relatively low atomic weight, the use of helium as a diluent gas can reduce chipping of the upper corners of the fin-type semiconductor regions 102 due to helium ions from the diluent gas. Although hydrogen is an element having the smallest atomic weight, a hydrogen plasma is more capable of chipping the fin-type semiconductor regions than a helium plasma because the union of hydrogen radicals and silicon in a plasma forms $Si_xH_y$. Therefore, helium exhibiting extremely low reactivity with other elements is more preferably used as the diluent gas than hydrogen.

In this embodiment, a gas which is used for plasma doping of carbon and an impurity into the fin-type semiconductor regions 102 and which contains carbon or an impurity preferably does not contain oxygen. This can prevent semiconductor forming the fin-type semiconductor regions 102 and the introduced impurity from being oxidized, and thus, the resistance of the impurity-introduced layers (e.g., the extension regions 105) formed in the fin-type semiconductor regions 102 can be prevented from increasing, thereby preventing degradation in the characteristics of the fin-type semiconductor device. Specifically, for example, a gas of carbon and hydrogen may be used as the gas containing carbon, and, for example, a gas of the impurity and hydrogen, such as a gas of boron and hydrogen, a gas of arsenic and hydrogen, or a gas of phosphorus and hydrogen, may be used as the gas containing the impurity. Here, when the molecular weight of the gas of carbon and hydrogen is lower than that of the gas of the impurity and hydrogen, this allows the carbon-introduced layers to be deeper than the impurity-introduced layers, thereby forming impurity-introduced layers each having a shallower junction depth. In order to obtain such an advantage, e.g., $B_2H_6$ (27.67 g/mol) may be used as the gas of the impurity and hydrogen, and, e.g., $CH_4$ (methane: 16.04 g/mol) may be used as the gas of carbon and hydrogen. Alternatively, e.g., $AsH_3$ (77.9454 g/mol) may be used as the gas of the impurity and hydrogen, and, e.g., $CH_4$ (methane: 16.04 g/mol), $C_2H_6$ (ethane: 30.07 g/mol), $C_3H_6$ (cyclopropane: 42.08 g/mol), $C_3H_8$ (propane: 44 g/mol), $C_4H_{10}$ (butane: 58.12 g/mol), or $C_4H_{10}$ (isobutane: 58.12 g/mol) may be used as the gas of carbon and hydrogen. Alternatively, e.g., $PH_3$ (34.00 g/mol) may be used as the gas of the impurity and hydrogen, and, e.g., $CH_4$ (methane: 16.04 g/mol) or $C_2H_6$ (ethane: 30.07 g/mol) may be used as the gas of carbon and hydrogen. In order to prevent the leakage current caused by the carbon-introduced layers, the carbon-introduced layers may be shallower than the impurity-introduced layers.

INDUSTRIAL APPLICABILITY

The present invention relates to methods for fabricating a semiconductor device, and plasma doping systems, and is useful to provide a three-dimensional semiconductor device including fin-type semiconductor regions on a substrate, and exhibiting desired characteristics.

DESCRIPTION OF REFERENCE CHARACTERS

1 Vacuum Chamber
1A Air Exit
2 Gas Supply Unit
2a Impurity Material Gas Supply Unit
2b Helium Supply Unit
2c Carbon Material Gas Supply Unit
2d Impurity Material Gas Supply Unit
2e Helium Supply Unit
2f Carbon Material Gas Supply Unit
3 Turbomolecular Pump
4 Pressure Controlling Valve
5 High-Frequency Power Supply
6 Sample Electrode
7 Top Plate
7a Vacuum Chamber Inner Surface
7b Outer Surface
8 Coil
9 Silicon Substrate
10 High-Frequency Power Supply
11 First Gas Supply Pipe
12 Substrate Central Portion Gas Ejection Port
13 Second Gas Supply Pipe
14 Substrate Peripheral Portion Gas Ejection Port
15 First Gas Passage
16 Second Gas Passage
17 Gas Passage Formation Member
20 Controller
21 Memory
MFC1 First Mass Flow Controller
MFC2 Second Mass Flow Controller
MFC3 Third Mass Flow Controller
MFC4 Fourth Mass Flow Controller
MFC5 Fifth Mass Flow Controller
MFC6 Sixth Mass Flow Controller
100 Semiconductor Substrate
101 Insulating Film
102 Fin-Type Semiconductor Region
102a Crystal Region
103 Gate Electrode
104 Resist Pattern
105 Extension Region
106 Insulative Sidewall Spacer
107 Source/Drain Region

The invention claimed is:

1. A method for fabricating a semiconductor device, the method comprising:
introducing an impurity into a fin-type semiconductor formed on a substrate using a plasma doping process, thereby forming an impurity-introduced layer; and
introducing carbon into the fin-type semiconductor using a plasma doping process, thereby forming a carbon-introduced layer to overlap at least a part of the impurity-introduced layer.

2. The method of claim 1, wherein
the forming the impurity-introduced layer and the forming the carbon-introduced layer are performed in a same chamber.

3. The method of claim 2, wherein
the forming the impurity-introduced layer and the forming the carbon-introduced layer are simultaneously performed using a mixture of a gas containing the impurity and a gas containing carbon.

4. The method of claim 1, wherein
the forming the impurity-introduced layer includes forming an amorphous layer by impingement of ions contained in a plasma to overlap at least a part of the impurity-introduced layer while allowing a crystal layer to remain inside the fin-type semiconductor.

5. The method of claim 4 further comprising
after the forming the impurity-introduced layer and the forming the carbon-introduced layer, subjecting the amorphous layer to a heat treatment to recover crystallinity of the amorphous layer.

6. The method of claim 1, wherein
the forming the impurity-introduced layer and the forming the carbon-introduced layer are each performed at a pressure of equal to or less than 0.35 Pa.

7. The method of claim 6, wherein
the forming the impurity-introduced layer and the forming the carbon-introduced layer are each performed at a bias voltage of equal to or less than 250 V.

8. The method of claim 7, wherein
a total plasma treatment time in the forming the impurity-introduced layer and the forming the carbon-introduced layer is equal to or less than 72 seconds.

9. The method of claim 1, wherein
a total plasma treatment time in the forming the impurity-introduced layer and the forming the carbon-introduced layer is equal to or less than a maximum total plasma treatment time previously set based on the pressures and bias voltages in both of the forming the impurity-introduced layer and the forming the carbon-introduced layer.

10. The method of claim 1, wherein
the forming the impurity-introduced layer is performed using a first gas containing at least one element selected from boron, arsenic, and phosphorus, and
the forming the carbon-introduced layer is performed using a second gas containing carbon.

11. The method of claim 10, wherein
the first gas and the second gas are used while being diluted with helium.

12. The method of claim 10, wherein
the second gas is a gas containing carbon and hydrogen.

13. The method of claim 10, wherein
the first gas is a gas containing boron and hydrogen, a gas containing arsenic and hydrogen, or a gas containing phosphorus and hydrogen, and
the second gas contains carbon and hydrogen and has a lower molecular weight than the first gas.

14. The method of claim 13, wherein
the first gas is $B_2H_6$, and
the second gas is $CH_4$ (methane).

15. The method of claim 13, wherein
the first gas is $AsH_3$, and
the second gas is $CH_4$ (methane), $C_2H_6$ (ethane), $C_3H_6$ (cyclopropane), $C_2H_8$ (propane), $C_4H_{10}$ (butane), or $C_4H_{10}$ (isobutane).

16. The method of claim 13, wherein
the first gas is $PH_3$, and
the second gas is $CH_4$ (methane) or $C_2H_6$ (ethane).

17. A plasma doping system for use in the method of claim 1, the system comprising:
- a chamber in which the substrate is placed;
- a first gas supply unit for supplying a gas containing the impurity into the chamber; and
- a second gas supply unit for supplying a gas containing carbon into the chamber.

18. The system of claim 17 further comprising a third gas supply unit for supplying a diluent gas into the chamber.

19. The method of claim 1, wherein in the step of introducing carbon, carbon is introduced into upper and side portions of the fin-type semiconductor.

* * * * *